(12) United States Patent
Kim et al.

(10) Patent No.: US 11,322,220 B2
(45) Date of Patent: May 3, 2022

(54) MEMORY SYSTEM INCLUDING A FLASH MEMORY DEVICE AND A MEMORY CONTROLLER

(71) Applicant: FADU Inc., Seoul (KR)

(72) Inventors: Hongseok Kim, Seoul (KR); Kyoungseok Rha, Seoul (KR); EHyun Nam, Seoul (KR)

(73) Assignee: FADU Inc., Seoul (KR)

( * ) Notice: Subject to any disclaimer, the term of this patent is extended or adjusted under 35 U.S.C. 154(b) by 0 days.

(21) Appl. No.: 16/953,485

(22) Filed: Nov. 20, 2020

(65) Prior Publication Data

US 2021/0158885 A1    May 27, 2021

Related U.S. Application Data

(60) Provisional application No. 62/938,391, filed on Nov. 21, 2019.

(30) Foreign Application Priority Data

Nov. 21, 2019  (KR) .................. 10-2019-0150197

(51) Int. Cl.
   *G11C 29/42*   (2006.01)
   *G11C 7/22*    (2006.01)
   (Continued)

(52) U.S. Cl.
   CPC .............. *G11C 29/42* (2013.01); *G11C 7/222* (2013.01); *G11C 8/18* (2013.01); *G11C 29/44* (2013.01)

(58) Field of Classification Search
   CPC ........... G11C 29/42; G11C 7/222; G11C 8/18; G11C 29/44
   See application file for complete search history.

(56) References Cited

U.S. PATENT DOCUMENTS 7,636,262 B2   12/2009   Kim et al.
8,443,263 B2    5/2013   Selinger et al.
(Continued)

OTHER PUBLICATIONS

Lee, Joong-Ho. "CRC (Cyclic Redundancy Check) Implementation in High-Speed Semiconductor Memory." *2015 8th International Conference on Control and Automation (CA)*. IEEE, 2015 (pp. 17-20).

(Continued)

*Primary Examiner* — Tuan T Nguyen
(74) *Attorney, Agent, or Firm* — NSIP Law

(57) ABSTRACT

A memory system is provided. In the memory system, a memory controller transmits a write enable signal and a data strobe signal to a flash memory device, a command or an address is transmitted at a rising edge or a falling edge of the write enable signal through a data line in a single data rate (SDR) scheme, and input data is transmitted at each of a rising edge and a falling edge of the data strobe signal through the data line in a double data rate (DDR) scheme. The memory controller includes a parity signal generation unit configured to receive the write enable signal transmitted in the DDR scheme and output a parity signal by generating a first parity bit for the input data. The flash memory device includes a bit error detection unit configured to receive the parity signal output from the memory controller, generate a second parity bit for the input data received by the flash memory device, and determine whether a bit error has occurred to the input data by performing a parity check.

8 Claims, 4 Drawing Sheets

(51) Int. Cl.
*G11C 8/18* (2006.01)
*G11C 29/44* (2006.01)

(56) References Cited

U.S. PATENT DOCUMENTS

| | | | | |
|---|---|---|---|---|
| 2003/0026161 | A1* | 2/2003 | Yamaguchi | G11C 7/1006 |
| | | | | 365/230.03 |
| 2011/0235426 | A1* | 9/2011 | Oh | G11C 16/06 |
| | | | | 365/185.18 |
| 2013/0318285 | A1* | 11/2013 | Pignatelli | G06F 12/0246 |
| | | | | 711/103 |
| 2014/0006730 | A1* | 1/2014 | Zain | G06F 13/1694 |
| | | | | 711/155 |

OTHER PUBLICATIONS

"Open NAND Flash Interface Specification", Open NAND Flash Interface, Dec. 12, 2017 (pp. 1-338).
Korean Office Action dated Dec. 17, 2019 in counterpart Korean Patent Application No. 10-2019-0150197 (5 pages in Korean).
Korean Notice of Allowance dated Sep. 7, 2020 in counterpart Korean Patent Application No. 10-2019-0150197 (2 pages in Korean).

* cited by examiner

MEMORY SYSTEM INCLUDING A FLASH MEMORY DEVICE AND A MEMORY CONTROLLER

CROSS REFERENCE TO RELATED APPLICATIONS

This application claims the benefit under 35 USC 119(e) of U.S. Provisional Application No. 62/938,391 filed on Nov. 21, 2019, which claims the benefit under 35 USC 119(a) and 365(b) of Korean Patent Application No. 10-2019-0150197, filed on Nov. 21, 2019, in the Korean Intellectual Property Office, the entire disclosure of which is incorporated herein by reference for all purposes.

BACKGROUND

1. Field

The disclosure relates to a memory system including a flash memory device and a memory controller.

2. Description of Related Art

Memory devices are storage devices implemented with semiconductors. The memory devices are categorized into volatile memory device and non-volatile memory device according to the storage mechanisms of information. Volatile memory devices include dynamic random access memory (DRAM) and static random access memory (SRAM). Although the volatile memory device provides fast read and write speeds, the volatile memory device loses stored information when it is powered off. In contrast, the non-volatile memory device maintains its stored information even after it is powered off and thus is used as a storage medium for storing data to be preserved. Non-volatile memory devices include erasable programmable read only memory (EPROM), electrically erasable programmable read only memory (EEPROM), ferroelectric RAM (FRAM), phase change RAM (PRAM), magnetoresistive RAM (MRAM), and flash memory. Flash memories include NOR flash memory and NAND flash memory. The NAND flash memory is widely used as an audio and video data storage medium for information devices such as a computer, a smartphone, a digital camera, a voice recorder, and a camcorder.

The NAND flash memory is provided with multiple input and output (TO) pins, and a memory controller controls the IO pins to perform an IO operation such as command input, address input, data input, and data output for the flash memory. Commands and addresses are input in a low-speed scheme, single data rate (SDR), whereas data is input and output in a high-speed scheme, double data rate (DDR). Due to fast transmission, DDR has a signal integrity (SI) issue and is vulnerable to bit errors. Therefore, bit errors may occur to the data during DDR data input transfer, thereby significantly decreasing flash memory-based storage reliability. There is thus a pressing need for a method of increasing the reliability of high-speed data transmission.

SUMMARY

The present disclosure has been made in an effort to solve the above-mentioned problems of the prior art and an aspect of the present disclosure is to provide a memory system in which the usage of a write enable signal WE is dynamically changed to a parity check bit for a flash memory device supporting data transmission in double data rate (DDR), and a memory controller identifies whether a transmission error has been generated during data input and controls data retransmission in the presence of any transmission error.

According to an embodiment of the disclosure, a memory system is provided. In the memory system, a memory controller transmits a write enable signal and a data strobe signal to a flash memory device, a command or an address is transmitted at a rising edge or a falling edge of the write enable signal through a data line in a SDR scheme, and input data is transmitted at each of a rising edge and a falling edge of the data strobe signal through the data line in a DDR scheme. The memory controller includes a parity signal generation unit configured to receive the write enable signal transmitted in the DDR scheme and output a parity signal by generating a first parity bit for the input data. The flash memory device includes a bit error detection unit configured to receive the parity signal output from the memory controller, generate a second parity bit for the input data received by the flash memory device, and determine whether a bit error has occurred to the input data by performing a parity check.

In the memory system according to the embodiment of the disclosure, the parity signal generation unit may receive the write enable signal transmitted in the SDR scheme and output the write enable signal without any processing.

In the memory system according to the embodiment of the disclosure, the bit error detection unit may receive the write enable signal transmitted in the SDR scheme and output the write enable signal without any processing.

In the memory system according to the embodiment of the disclosure, when the bit error detection unit determines that no bit error has occurred to the input data, the memory controller may be configured to transmit a program command to the flash memory device to write the input data to the flash memory device, and when the bit error detection unit determines that a bit error has occurred to the input data, the memory controller may be configured to retransmit the input data.

In the memory system according to the embodiment of the disclosure, the flash memory device may further include a parity check status register configured to store a bit error detection result obtained by the bit error detection unit.

In the memory system according to the embodiment of the disclosure, the memory controller may transmit a status read command to the flash memory device, and the flash memory device may transmit the bit error detection result stored in the parity check status register to the memory controller in response to the status read command.

In the memory system according to the embodiment of the disclosure, the parity signal generation unit may include a parity generator configured to generate a first parity bit, and a multiplexer configured to receive the write enable signal and the first parity bit and output the write enable signal for a $(1-1)^{th}$ interface mode signal indicating the SDR scheme and the parity signal for a $(1-2)^{th}$ interface mode signal indicating the DDR scheme, in response to a first interface mode signal that distinguishes the SDR scheme and the DDR scheme from each other.

In the memory system according to the embodiment of the disclosure, the bit error detection unit may include a parity processor configured to receive the signal output from the multiplexer and output the received write enable signal for a $(2-1)^{th}$ interface mode signal indicating the SDR scheme and a signal corresponding to the write enable signal input to the parity signal generation unit in the DDR scheme for a $(2-2)^{th}$ interface mode signal indicating the DDR scheme, in response to a second interface mode signal that distinguishes the SDR scheme and the DDR scheme from each other, and a parity checker configured to generate the second parity bit, receive the parity signal selectively output from the multiplexer, and perform the parity check.

The features and advantages of the disclosure will become more apparent from the following description based on the attached drawings.

The terms or words used in the specification and claims should not be interpreted in a conventional and lexical sense. Rather, they should be interpreted as meanings and concepts consistent with the technical idea of the disclosure based on the principle that the inventor can appropriately define the concept of terms in order to explain his or her invention in the best way.

According to the disclosure, as the memory controller checks a transmission error probable to occur during data input and controls data retransmission in the presence of an error, the reliability of high-speed data transmission and hence the reliability of the flash memory-based storage may be increased.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
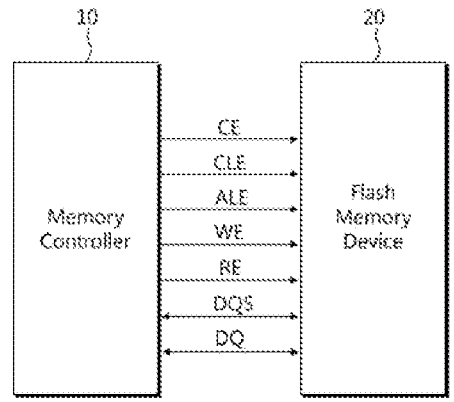
FIG. 1 is a block diagram illustrating a conventional flash memory system.

The objects, specific advantages, and novel features of the disclosure will become more apparent from the following detailed description and preferred embodiments, examples of which are illustrated in the accompanying drawings. The same reference numerals and signs denote the same or like components even when they are shown in different accompanying drawings from one another. The term as used in the disclosure, "$1^{st}$" "$2^{nd}$" "first" or "second' may be used for the names of various components, not limiting the components. These expressions are used only to distinguish one component from another component. Lest it should obscure the subject matter of the disclosure, a detailed description of well-known technologies is avoided.

Preferred embodiments of the disclosure will be described below in detail with reference to the attached drawings.

Figure 2:
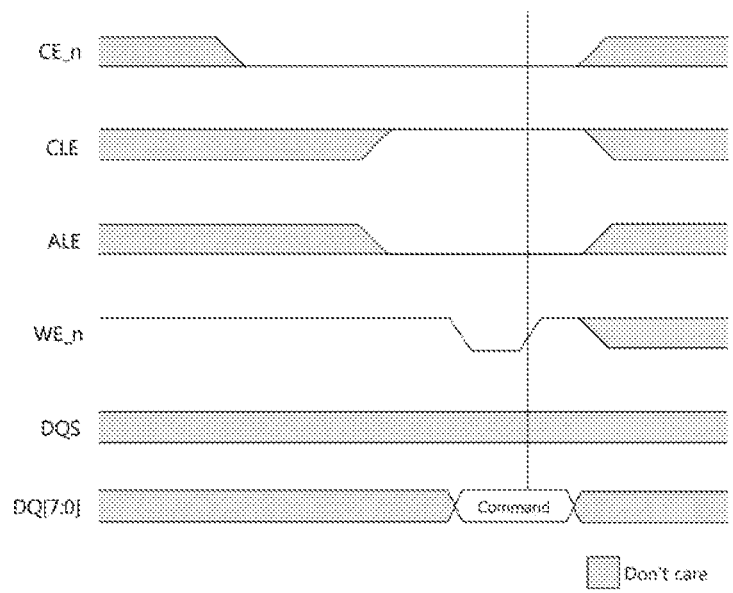
FIG. 2 is a timing diagram illustrating command input cycle in the conventional flash memory system illustrated in FIG. 1.
Figure 3:
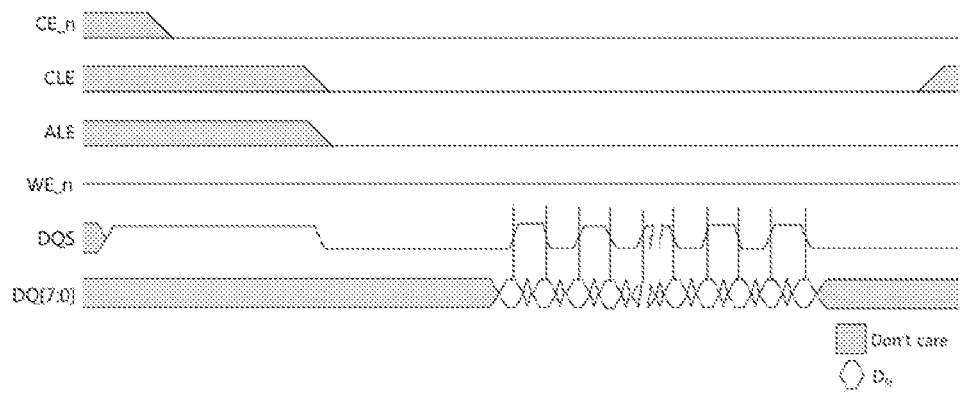
FIG. 3 is a timing diagram illustrating data input cycle in the conventional flash memory system illustrated in FIG. 1.

FIG. 1 is a block diagram illustrating a conventional flash memory system, FIG. 2 is a timing diagram illustrating command input cycle in the conventional flash memory system illustrated in FIG. 1, and FIG. 3 is a timing diagram illustrating data input cycle in the conventional flash memory system illustrated in FIG. 1.

Referring to FIG. 1, the conventional flash memory system includes a memory controller 10 and a flash memory device 20. The flash memory device 20 includes a plurality of input/output (IO) pins, through which the memory controller 10 transmits control signals and input data to the flash memory device 20 and receives output data from the flash memory device 20. The flash memory device 20 receives, through control pins, a chip enable signal CE, a command latch enable signal CLE, an address latch enable signal ALE, and a write enable signal WE, a read enable signal RE, and a data strobe signal DQS. Command, address, and input/output data are transmitted through a data line DQ.

An input/output operation of the flash memory system will be described with reference to the timing diagrams FIG. 2 and FIG. 3. FIG. 2 illustrates command input cycle, in which commands are input in single data rate (SDR) mode. That is, a command is transmitted to the flash memory device through the data line DQ at the rising edge of the write enable signal WE_n. Since the command latch enable signal CLE is "1" and the address latch enable signal ALE is "0", the type of a value transmitted through the data line DQ is determined as a command. On the contrary, while not shown, when the command latch enable signal CLE is "0" and the address latch enable signal ALE is "1", an address is input. The read enable signal RE is not used for input of a command and an address, and the data strobe signal DQS is not used for SDR transmission. Herein, the chip enable signal CE_n is active-low.

FIG. 3 illustrates data input cycle. Data is input in double data rate (DDR) mode. Input data is transmitted to the flash memory device through the data line DQ at the rising edge and falling edge of the data strobe signal DQS. In this case, the DDR transmission may be started and terminated by the command latch enable signal CLE and the address latch enable signal ALE. When both of the command latch enable signal CLE and the address latch enable signal ALE become "0", the DDR transmission starts. When either of the two signals CLE and ALE becomes "1", the DDR transmission ends. In the DDR transmission, the write enable signal WE_n is fixed to "1" to be deasserted.

Transmission is slow in SDR, whereas transmission is fast in DDR. However, in the high-speed DDR transmission scheme, there is a signal integrity (SI) issue, which is likely to cause a bit error during transmission. When a transmission error occurs during data input and contaminated data is programmed to the flash memory device as it is, the contaminated data is stored in a storage, thereby decreasing the reliability of the flash memory-based storage. In this context, a memory system according to the disclosure has been devised to increase the reliability of high-speed data transmission.

Figure 4:
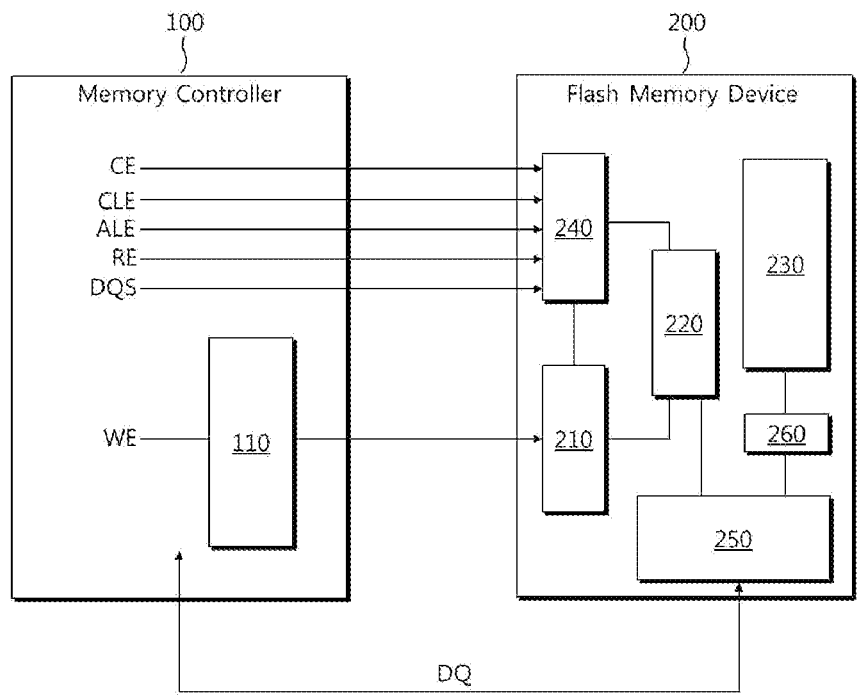
FIG. 4 is a block diagram illustrating a memory system according to an embodiment of the disclosure.
Figure 5:
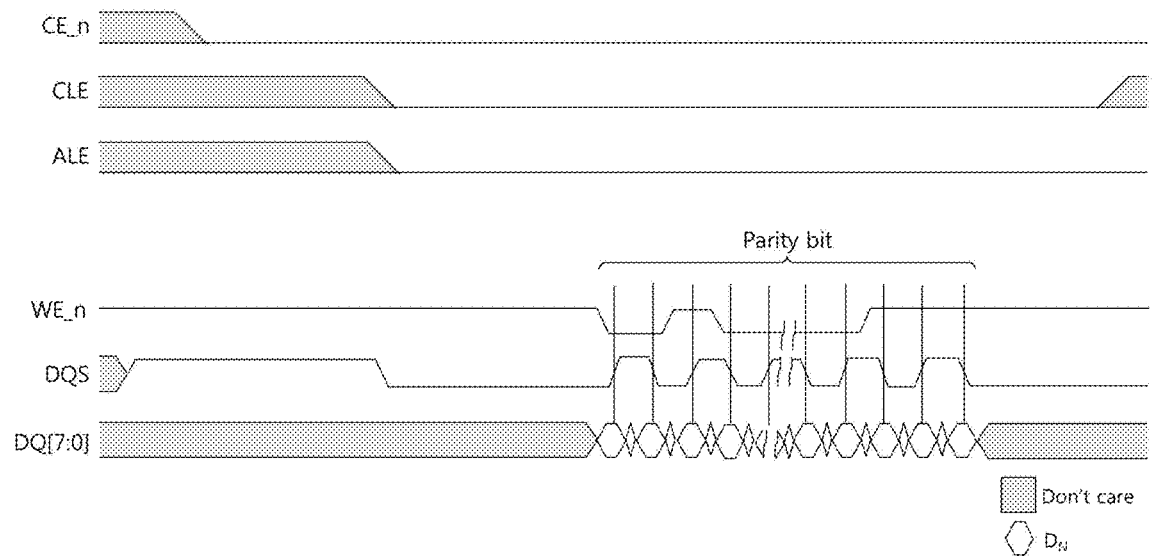
FIG. 5 is a timing diagram illustrating data input cycle in the memory system according to the embodiment of the disclosure.

FIG. 4 is a block diagram illustrating a memory system according to an embodiment of the disclosure, and FIG. 5 is a timing diagram illustrating data input cycle in the memory system according to the embodiment of the disclosure.

As illustrated in FIG. 4, in the memory system according to the embodiment of the disclosure in which a memory controller 100 transmits a write enable signal WE and a data strobe signal DQS to a flash memory device 200, a command or an address is transmitted at the rising edge or falling edge of the write enable signal WE through a data line DQ in SDR scheme, and input data is transmitted at each of the rising edge and the falling edge of the data strobe signal DQS through the data line DQ in DDR mode, the memory controller 100 includes a parity signal generation unit 110 configured to receive the write enable signal WE transmitted in DDR mode and output a parity signal by generating a first parity bit for transmitted input data, and the flash memory device 200 includes a bit error detection unit 210 configured to receive the parity signal output from the memory controller 100, generate a second parity bit for the input data received by the flash memory device 200, and determine whether there is a bit error in the input data by performing a parity check.

Specifically, the memory system according to the embodiment of the disclosure includes the memory controller 100 and the flash memory device 200.

The memory controller 100 may transmit control signals to the flash memory device 200, and the flash memory device 200 may operate in one of a command input state, an address input state, a data input state, and a data output state in response to the control signals.

The control signals from the memory controller 100 may include a chip enable signal CE, a command latch enable signal CLE, an address latch enable signal ALE, and a write enable signal WE, a read enable signal RE, and a data strobe signal DQS, and may be transmitted to the flash memory device 200 through IO pins of the flash memory device 200.

A command input is based on an SDR interface mode. A command is transmitted through the data line DQ at the rising or falling edge of the write enable signal WE. When the write enable signal WE is active-low, the command is transmitted at the rising edge of the write enable signal WE (see FIG. 2), and when the write enable signal WE is active-high, the command is transmitted at the falling edge of the write enable signal WE.

An address is input in the same manner as the command input. When the command latch enable signal CLE is "1" and the address latch enable signal ALE is "0", the type of a value transmitted through the data line DQ is determined as a command. On the contrary, when the command latch enable signal CLE is "0" and the address latch enable signal ALE is "1", the type of the transmitted value is determined as an address. The read enable signal RE is not used for command input and address input, and is fixed to "1" to be deasserted. Further, due to SDR transmission, the data strobe signal DQS is not used and is fixed to "0" to be deasserted.

Unlike command/address input, data input is based on a DDR interface mode. Input data is transmitted to the flash memory device 200 through the data line DQ at the rising and falling edges of the data strobe signal DQS. In this case, the DDR transmission may be started and terminated by the command latch enable signal CLE and the address latch enable signal ALE. Compared to the conventional flash memory system in which data is input by DDR transmission and thus the write enable signal WE is fixed to the deasserted state "1" without being used, the write enable signal WE is used as a parity check bit by changing its usage during DDR transmission to detect a bit error during transmission in the memory system of the disclosure.

In the memory system according to the embodiment of the disclosure, the memory controller 100 includes the parity signal generation unit 110.

Referring to FIG. 5, the parity signal generation unit 110 generates a first parity bit for input data transmitted through the data line DQ. The parity signal generation unit 110 also receives the write enable signal WE. For the write enable signal WE transmitted in DDR, the parity signal generation unit 110 converts the write enable signal WE to a parity signal by reflecting the generated first parity bit and then output the parity signal. In contrast, the parity signal generation unit 110 may output the write enable signal WE transmitted in SDR without any processing. The output parity signal or write enable signal WE is transmitted to the flash memory device 200.

In the memory system according to the embodiment of the disclosure, the flash memory device 200 includes the bit error detection unit 210.

The bit error detection unit 210 receives the parity signal or the write enable signal WE from the parity signal generation unit 110. When receiving the parity signal, the bit error detection unit 210 generates a second parity bit for input data received by the flash memory device 200. Further, the bit error detection unit 210 extracts the first parity bit from the received parity signal, and performs a parity check by comparing the first parity bit with the second parity bit. The bit error detection unit 210 may determine whether a bit error has occurred to the input data during DDR transmission from the result of the parity check. On the other hand, when receiving the write enable signal WE during SDR transmission, the bit error detection unit 210 skips the second parity bit generation and the parity check.

In the memory system according to the embodiment of the disclosure, the flash memory device 200 may further include a control logic and voltage generator 240.

The control logic and voltage generator 240 receives control signals from the memory controller 100. The write enable signal WE is transmitted to the control logic and voltage generator 240 through the bit error detection unit 210. However, when the write enable signal WE transmitted in DDR has been converted to the parity signal in the parity signal generation unit 110, the bit error detection unit 210 may transmit the same signal as the original write enable signal WE to the control logic and voltage generator 240. That is, when a first write enable signal transmitted in DDR has been input to the parity signal generation unit 110, converted to a parity signal, and output to the bit error detection unit 210, the bit error detection unit 210 may generate a second write enable signal identical to the first write enable signal prior to the signal conversion and transmit the second write enable signal to the control logic and voltage generator 240.

In the memory system according to the embodiment of the disclosure, the flash memory device 200 may further include a parity check status register 220.

The parity check status register 220 stores a bit error detection result obtained by the bit error detection unit 210. The stored bit error detection result may be transmitted to the memory controller 100. In one embodiment, when the memory controller 100 transmits a status read command to the flash memory device 200, the flash memory device 200 may transmit the bit error detection result stored in the parity check status register 220 to the memory controller 100 in response to the status read command.

Upon receipt of the bit error detection result, when the memory controller 100 identifies the presence of a bit error, the memory controller 100 may retransmit the input data. The bit error detection result for the input data, stored in the parity check status register 220 may be deleted in response to a command from the memory controller 100.

On the contrary, when the memory controller 100 identifies the absence of any bit error, the memory controller 100 may transmit a program command for the input data to the memory device 200, so that the data may be programmed to the flash memory device 200.

In the memory system according to the embodiment of the disclosure, the flash memory device 200 may further include a data IO logic 250.

The data IO logic 250 receives the input data through the data line DQ and transmits output data to the memory controller 100. The bit error detection result stored in the parity check status register 220 may also be transmitted to the memory controller 100 through the data IO logic 250.

In the memory system according to the embodiment of the disclosure, the flash memory device 200 may further include a flash cell array 230 and a page register 260.

The flash memory device 200 performs read and program operations on a page basis. The flash memory device 200 may load data of a page into the page register 260 in response to a read command from the memory controller 100. When the data is loaded to the page register 260, the flash memory device 200 may transmit the data to the memory controller 100.

In a program operation, data to be programmed may be transmitted to the page register 260, and the data of the page register 260 may be programmed to the flash cell array 230 in response to the program command from the memory controller 100.

Now, a description will be given of an embodiment of implementing the above-described parity signal generation unit 110, bit error detection unit 210, and parity check status register 220.

Figure 6:
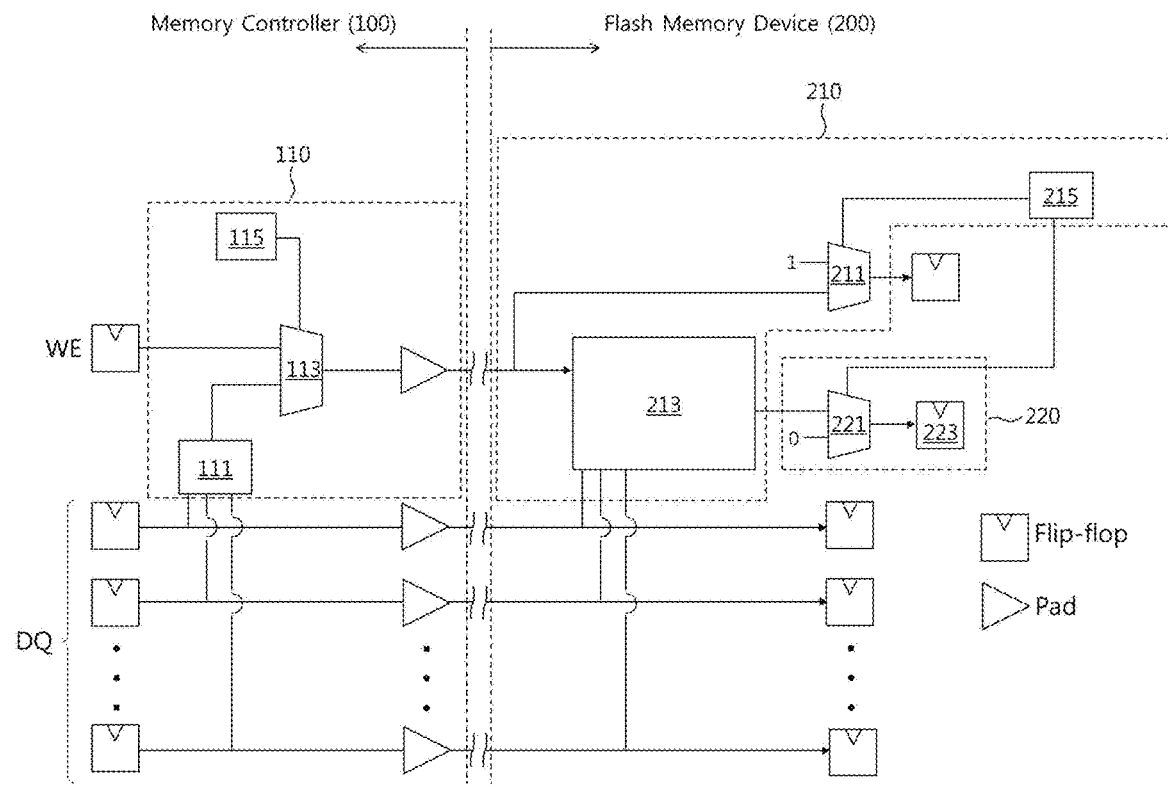
FIG. 6 is a diagram illustrating a control logic for data input in the memory system according to the embodiment of the disclosure.

FIG. 6 illustrates a control logic for data input in the memory system according to the embodiment of the disclosure.

Referring to FIG. 6, the parity signal generation unit 110 may include a parity signal generator 111 and a multiplexer 113.

The parity signal generator 111 generates a first parity bit for input data to be transmitted from the memory controller 100 and converts the first parity bit to a signal. The signal in which the first parity bit is reflected is defined as a parity signal. The data line DQ may be implemented with a plurality of flip-flops and IO pads which one-to-one correspond to the flip-flops. For the input data to be transmitted through the data line DQ, an exclusive OR (XOR) operation may be performed with a combination of logic gates to generate the first parity bit.

The multiplexer 113 selectively outputs one of the write enable signal WE and the parity signal generated from the parity signal generator 111 in response to a first interface mode signal. The first interface mode signal is a signal that distinguishes SDR and DDR from each other, and includes a $(1\text{-}1)^{th}$ interface mode signal for SDR and a $(1\text{-}2)^{th}$ interface mode signal for DDR. The multiplexer 113 outputs the write enable signal in response to the $(1\text{-}1)^{th}$ interface mode signal and outputs the parity signal in response to the $(1\text{-}2)^{th}$ interface mode signal. For example, because one of the command latch enable signal CLE and the address latch enable signal ALE is "1" in SDR, and both of the command latch enable signal CLE and the address latch enable signal ALE are "0" in DDR, the $(1\text{-}1)^{th}$ interface mode signal and the $(1\text{-}2)^{th}$ interface mode signal may be distinguished from each other.

The parity signal generation unit 110 may further include a first interface mode signal generator 115 that generates the first interface mode signal and transmits it to the multiplexer 113. The first interface mode signal generator 115 may generate the $(1\text{-}1)^{th}$ interface mode signal or the $(1\text{-}2)^{th}$ interface mode signal according to SDR or DDR and transmit the generated signal to the multiplexer 113.

The bit error detection unit 210 may include a signal processor 211 and a parity checker 213.

The signal processor 211 receives the signal output from the multiplexer 113 of the parity signal generation unit 110, that is, the write enable signal WE or the parity signal, and processes the signal in response to a second interface mode signal. The second interface mode signal is a signal that distinguishes SDR and DDR from each other, and includes a $(2\text{-}1)^{th}$ interface mode signal for SDR and a $(2\text{-}2)^{th}$ interface mode signal for DDR. For the $(2\text{-}1)^{th}$ interface mode signal, the write enable signal is input and output without any processing. For the $(2\text{-}2)^{th}$ interface mode signal, the parity signal is input, but a signal corresponding to the write enable signal WE input to the parity signal generation unit 110 is output. In one embodiment, the signal processor 211 may be a multiplexer and, when receiving the parity signal, may output "1" indicating a deasserted state in response to the $(2\text{-}1)^{th}$ interface mode signal. However, "1" is assumed for the case in which the write enable signal WE is active-low, and when the write enable signal WE is active-high, "0" may be output as a value indicating the deasserted state.

As described before, the $(2\text{-}1)^{th}$ interface mode signal and the $(2\text{-}2)^{th}$ interface mode signal may be distinguished from each other by the command latch enable signal CLE and the address latch enable signal ALE, and a second interface mode signal generator 215 may further be included to generate the second interface mode signal and transmit the second interface mode signal to the signal processor 211.

The parity checker 213 generates a second parity bit for the input data received by the flash memory device 200 and performs a parity check by receiving the parity signal selectively output from the parity signal generation unit 110. Since the parity checker 213 is a known technology implemented by a combination of logic gates, the parity checker 213 will not be described in detail herein.

The parity check status register 220 is configured to store a bit error detection result obtained through the parity check performed by the parity checker 213. In one embodiment, in the case where the parity checker 213 transmits "1" in the presence of a bit error and "0" in the absence of a bit error, a multiplexer 221 receiving the signals may transmit a signal received from the parity checker 213 to a flip-flop 223 in response to the $(2\text{-}2)^{th}$ interface mode signal, and "0" to the flip-flop 223 in response to the $(2\text{-}1)^{th}$ interface mode signal.

A method of controlling a program operation by the memory controller according to an embodiment of the disclosure will be described below.

Figure 7:
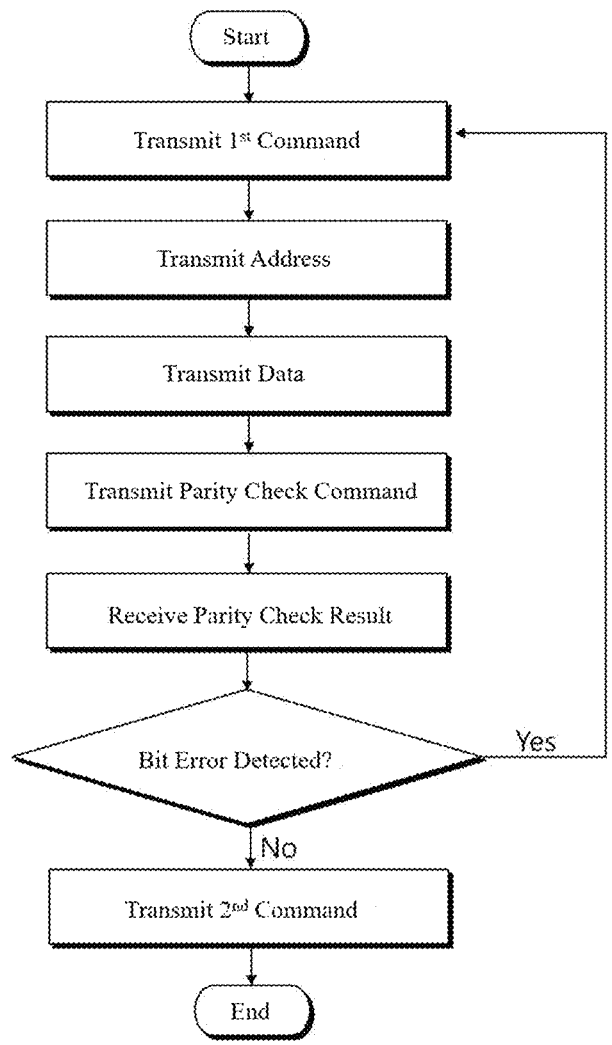
FIG. 7 is a flowchart illustrating a method of controlling a program operation in a memory controller according to an embodiment of the disclosure.

FIG. 7 is a flowchart illustrating a method of controlling a program operation in the memory controller according to an embodiment of the disclosure.

In order to program data to the flash memory device, the memory controller transmits a first command to the flash memory device, indicating that an IO sequence for programming will start. The memory controller then transmits an address for designating a target page for programming and inputs data to the flash memory device. Subsequently, the memory controller transmits a parity check command to the flash memory device and receives a parity check result from the flash memory device. When a bit error is not identified, the memory controller transmits a second command to the flash memory device to complete the programming. On the contrary, when a bit error is identified, the memory controller performs the data input process again by retransmitting the first command to the flash memory device.

Overall, according to the disclosure, as the memory controller checks a transmission error probable to occur during data input and controls data retransmission in the presence of an error, the reliability of high-speed data transmission and hence the reliability of the flash memory-based storage may be increased.

While the disclosure has been described in detail with reference to specific embodiments, the embodiments are intended only for describing the disclosure, not limiting the disclosure. It is apparent to those skilled in the art that many variations or modifications can be made without departing the scope and spirit of the disclosure.

Simple modifications and changes of the disclosure fall within the scope of the disclosure and the specific protection scope of the disclosure will become apparent from the appended claims.

What is claimed is:

1. A memory system in which a memory controller transmits a write enable signal and a data strobe signal to a flash memory device, a command or an address is transmitted at a rising edge or a falling edge of the write enable signal through a data line in a single data rate (SDR) scheme, and input data is transmitted at each of a rising edge and a falling edge of the data strobe signal through the data line in a double data rate (DDR) scheme,
   wherein the memory controller comprises a parity signal generation unit configured to receive the write enable signal transmitted in the DDR scheme and output a parity signal by generating a first parity bit for the input data, and
   wherein the flash memory device comprises a bit error detection unit configured to receive the parity signal output from the memory controller, generate a second parity bit for the input data received by the flash memory device, and determine whether a bit error has occurred to the input data by performing a parity check.

2. The memory system according to claim 1, wherein the parity signal generation unit receives the write enable signal transmitted in the SDR scheme and outputs the write enable signal without any processing.

3. The memory system according to claim 1, wherein the bit error detection unit receives the write enable signal transmitted in the SDR scheme and outputs the write enable signal without any processing.

4. The memory system according to claim 1, wherein when the bit error detection unit determines that no bit error has occurred to the input data, the memory controller is configured to transmit a program command to the flash memory device to write the input data to the flash memory device, and when the bit error detection unit determines that a bit error has occurred to the input data, the memory controller is configured to retransmit the input data.

5. The memory system according to claim 1, wherein the flash memory device further comprises a parity check status register configured to store a bit error detection result obtained by the bit error detection unit.

6. The memory system according to claim 5, wherein the memory controller transmits a status read command to the flash memory device, and the flash memory device transmits the bit error detection result stored in the parity check status register to the memory controller in response to the status read command.

7. The memory system according to claim 1, wherein the parity signal generation unit comprises:
   a parity generator configured to generate a first parity bit; and
   a multiplexer configured to receive the write enable signal and the first parity bit and output the write enable signal for a first SDR interface mode signal indicating the SDR scheme and the parity signal for a first DDR interface mode signal indicating the DDR scheme, in response to a first interface mode signal that distinguishes the SDR scheme and the DDR scheme from each other.

8. The memory system according to claim 7, wherein the bit error detection unit comprises:
   a parity processor configured to receive the signal output from the multiplexer and output the received write enable signal for a second SDR interface mode signal indicating the SDR scheme and a signal corresponding to the write enable signal input to the parity signal generation unit in the DDR scheme for a second DDR interface mode signal indicating the DDR scheme, in response to a second interface mode signal that distinguishes the SDR scheme and the DDR scheme from each other; and
   a parity checker configured to generate the second parity bit, receive the parity signal selectively output from the multiplexer, and perform the parity check.

* * * * *